United States Patent
Yeom et al.

[11] Patent Number: 6,156,636
[45] Date of Patent: Dec. 5, 2000

[54] METHOD OF MANUFACTURING A SEMICONDUCTOR DEVICE HAVING SELF-ALIGNED CONTACT HOLES

[75] Inventors: Kye-Hee Yeom; Kyu-Pil Lee, both of Kyunggi-do, Rep. of Korea

[73] Assignee: Samsung Electronics Co., Ltd., Tokyo, Japan

[21] Appl. No.: 09/265,890

[22] Filed: Mar. 11, 1999

[30] Foreign Application Priority Data

Apr. 2, 1998 [KR] Rep. of Korea ........................ 98-11615

[51] Int. Cl.⁷ ............................................. H01L 21/4763
[52] U.S. Cl. ............................................ 438/618; 438/618
[58] Field of Search ................................... 438/697, 618, 438/698, 704, 745, 738, 637, 638, 639, 640, 703, 705, 763, 783, 790, 666

[56] References Cited

U.S. PATENT DOCUMENTS 5,155,053  10/1992  Atkinson .................................. 437/40
5,849,635  12/1998  Akram et al. ........................... 438/704
5,877,092  3/1999  Lee et al. ................................ 438/738

*Primary Examiner*—David Nelms
*Assistant Examiner*—David Nhu
*Attorney, Agent, or Firm*—Jones Volentine, LLC

[57] ABSTRACT

A method of forming self-aligned contact holes of a semiconductor device presents bridging from occurring between contacts formed in the holes. First, gate electrode structures are formed on a semiconductor substrate. Next, an interlayer insulating film is formed over the gate electrode structures. The interlayer insulating film is formed by forming a first oxide layer of a reflowable material over the semiconductor substrate and gate electrode structures, planarization etching the first oxide layer until the upper portions of the gate electrode structures are uncovered, and then forming a second oxide layer on the planarized upper surface of the first oxide layer. The second oxide layer is selected to have a wet etch rate that is lower than that of the first oxide layer. Then, the insulating film is etched to form a contact hole between gate electrode structures. Finally, a self-aligned contact electrically connected with the semiconductor substrate is formed by filling the contact hole with conductive material.

8 Claims, 4 Drawing Sheets

METHOD OF MANUFACTURING A SEMICONDUCTOR DEVICE HAVING SELF-ALIGNED CONTACT HOLES

BACKGROUND OF THE INVENTION

1. Field of the Invention

The present invention relates to a method of manufacturing a semiconductor device, and more particularly to a method of manufacturing a semiconductor device having self-aligned contact holes.

2. Description of the Related Art

As the cell pitch is decreased in a semiconductor device, the process margin of forming a contact is also gradually decreased. Thus, the method of forming a self-aligned contact (SAC) has been developed and used. The SAC has some advantages as follows: first, a short will not easily occur, even if a misalignment occurs; second, although the space of a photoresist layer pattern is not made small, it is possible to form a contact hole having a small diameter; third, contact resistance can be decreased due to large contact area despite small contact size.

For this reason, it is expected that the SAC will be a promising method of forming a contact in LSI (Large Scale Integration). FIGS. 1A to 1C are the flow diagrams showing the process steps of a prior art method of forming a contact of a semiconductor device. Referring to FIG. 1A, a device isolation layer is formed on a semiconductor substrate to define an active and an inactive region. A gate electrode layer 4 is formed over the active region of the semiconductor substrate 1 disposing a gate oxide layer therebetween. As well-known in the art, the gate electrode layer 4 includes a gate electrode 4a and a gate mask 4b thereon. The gate mask 4b, for example, is formed of a silicon nitride layer to a thickness of about 1000 Å–2000 Å. A gate spacer 5 is formed on both side walls of the gate electrode layer 4 by etching back a silicon nitride layer to a thickness of about 500 Å–1000 Å by a conventional method.

A thin etch stop layer 6 is formed on the semiconductor substrate 1 to a thickness of about 50 Å–200 Å. The etch stop layer 6, like the gate mask 4B and the gate spacer 5, is formed of a silicon nitride layer.

In FIG. 1B, an interlayer insulating film 8 is formed on the etch stop layer 6. The interlayer insulating film 8 is formed of material which has an etch selectivity with respect to the gate mask 4b, gate spacer 5, and etch stop layer 6. The material is, for example, a BPSG (BoroPhosphoSiligate Gate) or a HDP (High Density Plasma) oxide layer. The interlayer insulating film 8 is formed to a thickness of about 3000 Å–7000 Å.

However, the HDP oxide layer has a relatively high stress, so that a silicon pit may be formed subsequent to the ion implanting and annealing process. The filling characteristics of the HDP oxide layer are not as good as those of the BPSG layer. The BPSG layer, which is very porous material, exhibits relatively low stress, compared with the HDP oxide layer. In addition, the filling characteristics of the BPSG layer are good. Therefore, HDP layer is not utilized as an insulating layer in the SAC process and BPSG layer is generally employed instead.

But the BPSG has a very high etch rate, so that a bridge may occur between contacts. The CMP (Chemical Mechanical Polishing) or etch back process is carried out thereon. In the planarization process with a BPSG layer whose etch rate is 5 times higher than that of HDP, the thickness variation of the interlayer insulating layer becomes bad. A photoresist pattern 10 is formed over the planar interlayer insulating film 8 to define contact regions.

Referring to FIG. 1C, the interlayer insulating film 8 is dry etched by utilizing the photoresist pattern 10 as a mask. During this SAC etch process, overetching is generally employed to the insulating layer so as to isolate electrically each contact pad. The interlayer insulating film 8 is etched on condition that it has an etch selectivity with respect to the gate mask 4B, gate spacer 5, and etch stop layer 6. Then the etch stop layer 6 is etched until the semiconductor substrate 1 is exposed.

Especially in the case of BPSG, overetching is generally performed due to its uneven surface topology. Accordingly, a shoulder of the gate is subject to the stress. Contact impurity ions are implanted into the semiconductor substrate 1 so as to decrease contact resistance.

A cleaning process is performed so as to remove a native oxide layer formed on the semiconductor substrate 1. A self-aligned contact 14 is formed, as shown in FIG. 1, by covering the interlayer insulating film 8 including the contact hole 11 with a conductive layer such as a polysilicon, and then etching the resultant structure.

If BPSG layer as the interlayer insulating film 8 is subject to implanting process of impurity ions, its wet etch rate will be more than 10 times higher with respect to the previous step of implanting ions, due to the implanting damage of the interlayer insulating film 8. In the cleaning process, after all, a bridge between contacts is occurred.

SUMMARY OF THE INVENTION

The present invention is made in view of the above problem. Accordingly, an object of the invention to provide a method of manufacturing a semiconductor device, which can form an interlayer insulating film whose wet etch rate is low without causing a void, by forming a multi-layer insulating film including insulating materials having good filling characteristics and a low wet etch rate.

It is another object of the invention to provide a method of manufacturing a semiconductor device which can prevent an interlayer insulating film from being overetched and stop a bridge between contacts by implanting contact impurity ions and increasing the wet etch rate of an interlayer insulating film in the cleaning process to form a contact hole.

According to the present invention, the method comprises the steps of forming a first insulating layer, a first conductive layer, and a second insulating layer on a semiconductor substrate in order; forming a gate electrode layer, including the second insulating pattern and the first conductive layer pattern, by partially etching the second insulating layer and the first conductive layer; forming a third insulating layer on the semiconductor substrate; forming spacers on the side walls of the gate electrode layers by etching the third insulating layer; forming a fourth insulating layers which is reflowable, having an etch selectivity with respect to the second and the third insulating layers on the semiconductor substrate; planarization etching the fourth insulating layer so as to expose the upper part of the gate electrode layers; forming a fifth insulating layer, having an etch selectivity with respect to the second and the third insulating layers, on the fourth insulating layer, with an insulating material whose wet etch rate is relatively lower than that of the fourth insulating layer; forming at least one contact hole by partially etching the fifth, the fourth, and the first insulating layers so as to expose the semiconductor substrate between the gate electrode layers; removing the native oxide layer below the contact holes by a wet etch process; and forming a contact electrically connected with the semiconductor substrate by filling the contact holes with the second conductive layer and then etching the resultant structure.

In the preferred embodiment of the present invention, the method of manufacturing the semiconductor device can further comprise a step of implanting impurity ions to decrease the contact resistance below the contact holes by utilizing the fifth insulating layer as a mask before the contact holes are filled with the second conductive layer.

In accordance with the present invention, the space formed by conductive layer patterns is filled with insulating material having good filling characteristics, which is reflowable. Thereafter, because an interlayer insulating film whose wet etch rate is low without causing a void can be formed, overetching an interlayer insulating film and causing a bridge between contacts, can thus be prevented.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

The preferred embodiment of the present invention will be now described with reference to the accompanying drawings FIG. 2A to FIG. 2D.

FIG. 2A to FIG. 2D are flow diagrams showing processes of a method of manufacturing a semiconductor device in accordance with a preferred embodiment of the present invention.

Figure 1A:
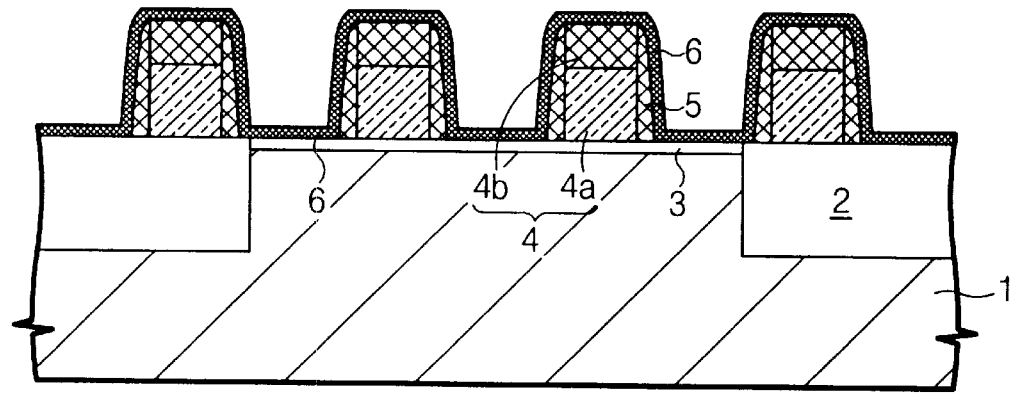
FIG. 1A to FIG. 1D are flow diagrams showing the process steps of a prior art method of manufacturing a semiconductor device.
Figure 1B:
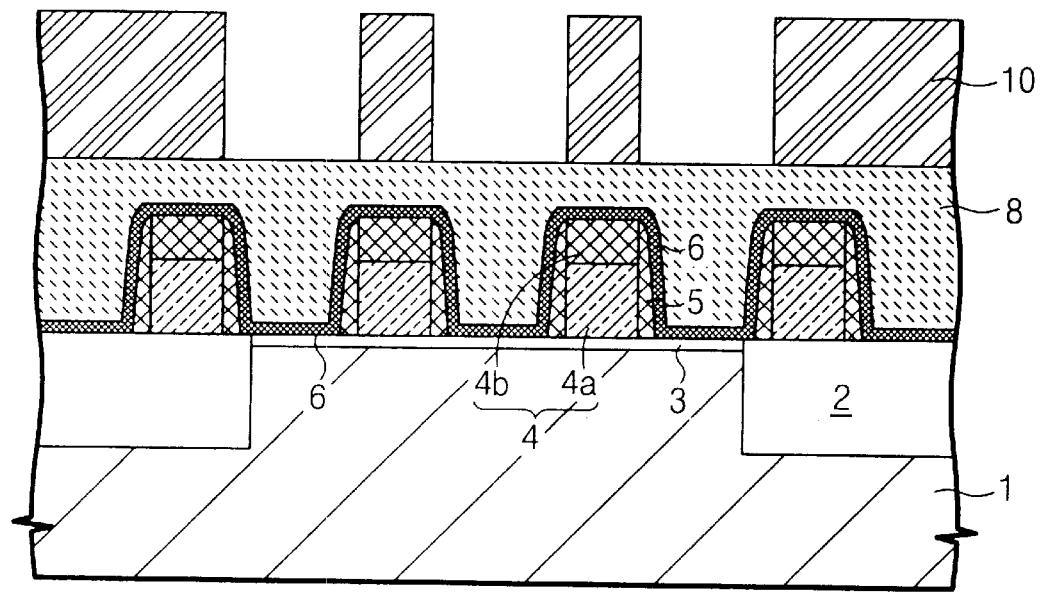
Figure 1C:
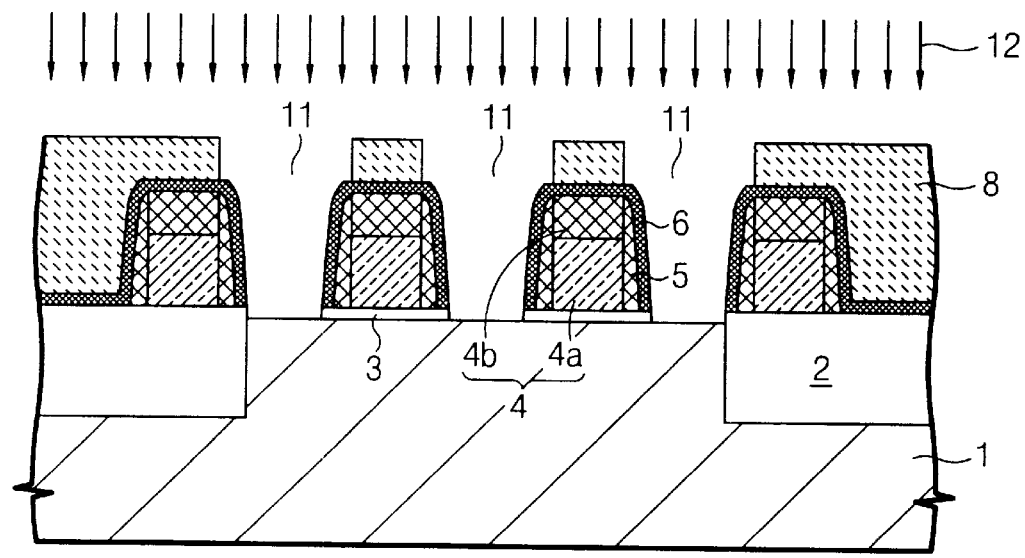
Figure 1D:
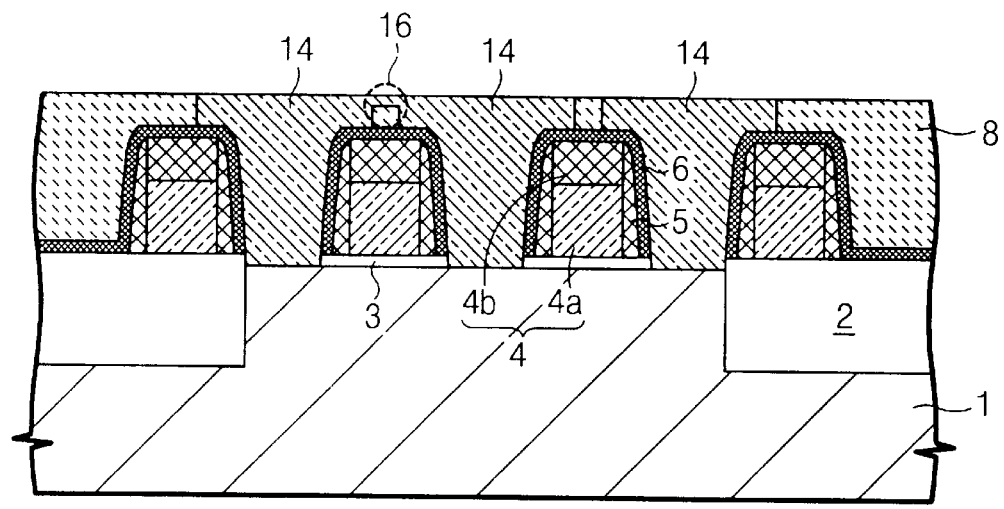
Figure 2A:
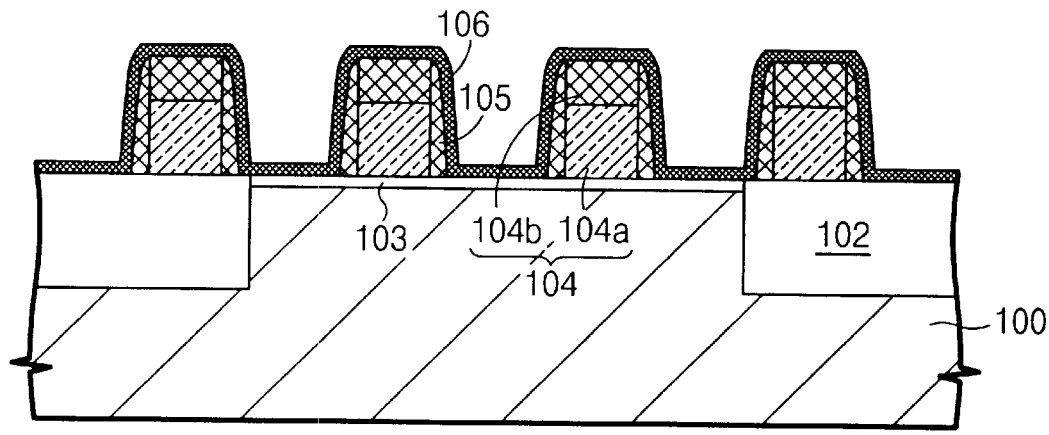
FIG. 2A to FIG. 2D are flow diagrams showing the process steps of a novel method for manufacturing a semiconductor device in accordance with a preferred embodiment of the present invention.

Referring to FIG. 2A, a device isolation layer 102 is formed on a semiconductor substrate 100 to define active and inactive regions. The device isolation layer is formed by LOCUS (Local Oxidation of Silicon) or STI (Shallow Trench Isolation), etc.

A gate electrode layer 104, including a gate electrode 104a and a gate mask 104b, is formed on the semiconductor substrate 100 by partially etching a conductive layer such as a deposited polysilicon and a first silicon nitride layer. That is, a conductive layer for forming the gate electrode 104a, and a first silicon nitride layer for forming a gate mask 104b, are deposited on the gate oxide layer 103 in order. The first silicon nitride layer for forming the gate mask 104b is formed to a thickness of about 1000 Å–2000 Å. The first silicon nitride layer and the conductive layer are patterned with a photolithography process. On the semiconductor substrate 100 at both sides of the gate electrode layer 104, impurity ions (not shown) for forming a source/drain region (not shown) are implanted.

A second nitride layer is formed on the semiconductor substrate 100 including the gate electrode layer to a thickness of about 500 Å–1000 Å. The second silicon nitride layer is etched, and a gate spacer 105 is formed on both walls of the gate electrode layer 104. A third silicon nitride layer 106 is formed as an etch stop layer on the semiconductor substrate 100 including the gate spacer 105. The third silicon nitride layer 106 is formed to a thickness of about 50 Å–100 Å so as to prevent the device isolation layer from being etched in forming a later contact hole.

Figure 2B:
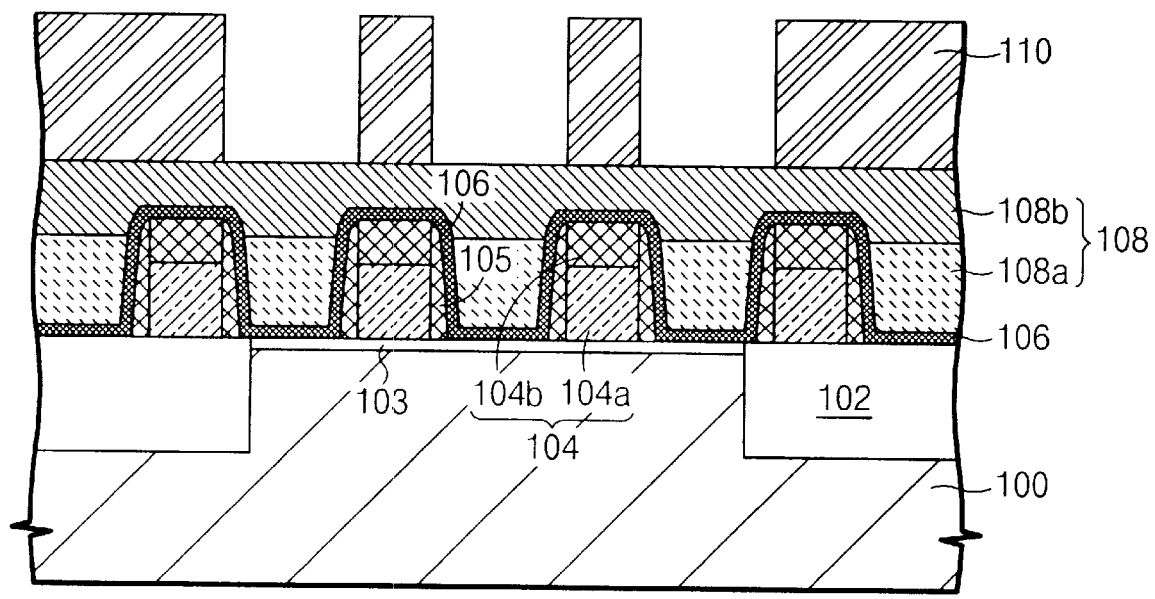

Referring to FIG. 2B, a first oxide layer 108a is formed which has good filling characteristics (that is, which is reflowable) on the third silicon nitride layer 106. In brief, the first oxide layer 108a is formed on the third silicon nitride layer 106. The first oxide layer 108a, preferably which is composed of BPSG, is formed to a thickness of about 3000 Å–7000 Å. The first oxide layer 108a is planarly etched with only the valley between the gate electrode layers 104 left. The planar etch process preferably utilizes CMP or an etch back process.

A second oxide layer 108b is formed on the third silicon nitride layer 106 including the first oxide layer 108a. Thus, the interlayer insulating film is formed completely. The interlayer insulating film 108 has a good etch selectivity with respect to the first or third silicon nitride layer. The second oxide layer 108b whose wet etch rate is relatively lower than that of the first oxide layer 108a is preferably formed of a PETEOS (Plasma-Enhanced CVD TetraEthyl OrthoSilicate). The second oxide layer 108b is formed to a thickness of about 1000 Å–3000 Å. A photoresist layer pattern 110 is formed on the interlayer insulating film 108, defining a region to form a contact.

Figure 2C:
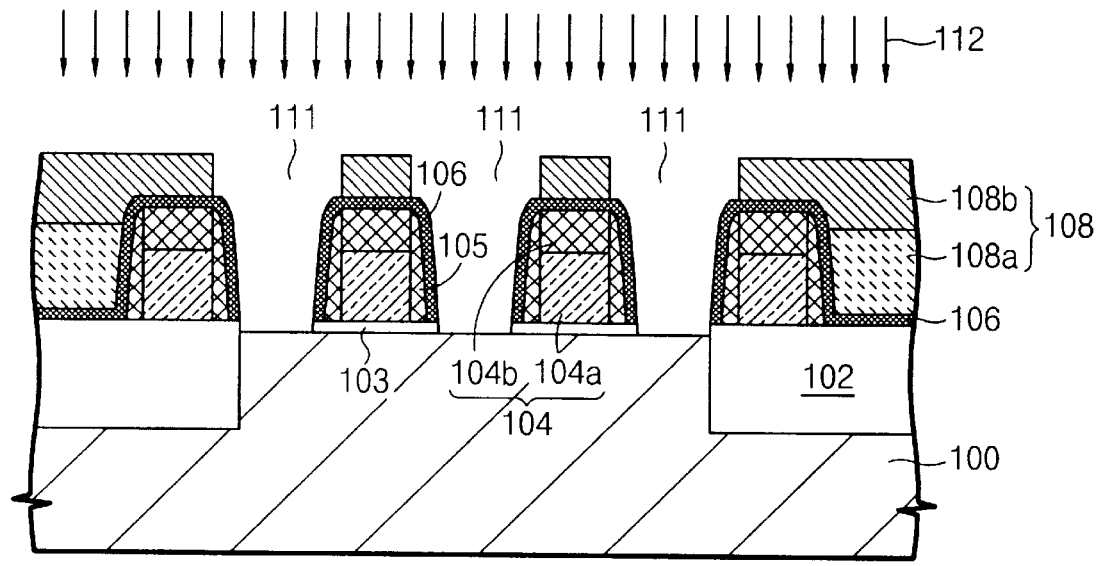

Referring to FIG. 2C, predetermined region of the interlayer insulating film 108 and the third silicon nitride layer 106 are etched by utilizing the photoresist layer pattern 110 as a mask, so that the semiconductor substrate 100 between gate electrode layers 104 is exposed. As a result, a contact hole is formed.

In forming the contact hole 111, the interlayer insulating film is etched on condition that it has an etch selectivity with respect to the first to the third silicon nitride layers 104b, 105, and 106. The third silicon nitride layer 106 prevents the device isolation layer from being etched (especially, in case a contact hole 111 is misaligned). Thereafter, the third silicon nitride layer is etched.

After the photoresist layer pattern 110 is removed, the contact impurity ions are implanted, utilizing the second oxide layer 108b as a mask, so that the contact resistance below the contact hole 111 may be decreased.

Similarly, the contact impurity ions 112 are implanted on the second oxide layer 108b whose wet etch rate is relatively lower than that of the first oxide layer 108a. Therefore, the wet etch rate of the first oxide layer 108a does not increase due to damage by implanting ion. Accordingly, the possibility of a bridge occurring between contacts is decreased.

Figure 2D:
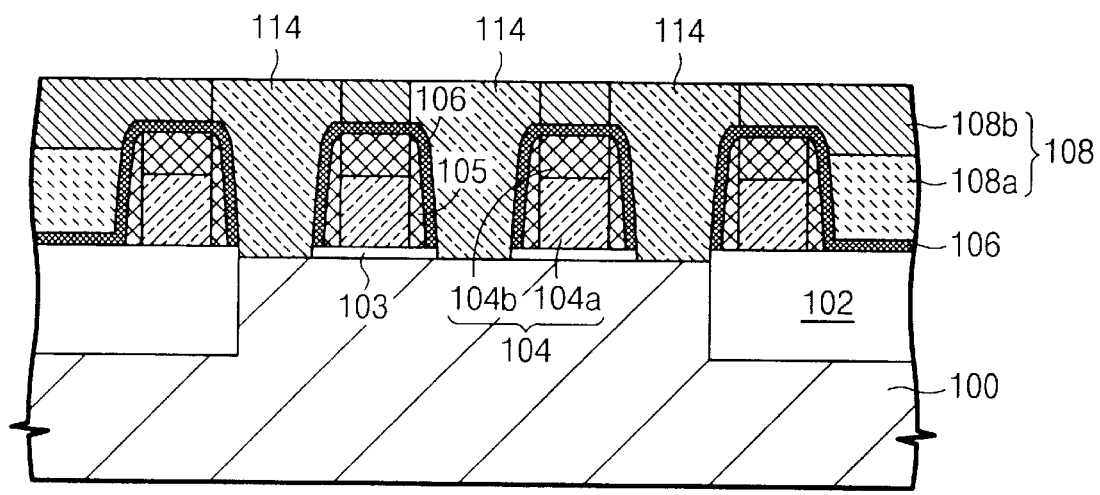

Finally, the native oxide layer below the contact hole 111 is removed by a wet etching process with a cleaning solution well-known in the art. A conductive layer for forming a contact, such as a polysilicon, is deposited on the second oxide layer 108b including the contact hole. Planarization etching performed on the conductive layer, with CMP or an etch back process, as shown in FIG. 2D, enables a self-aligned contact 114 to be formed.

In the prior method, an interlayer insulating film is formed by utilizing only insulating material that has a good filling characteristics but has a high wet etch rate. Therefore, some problems occur, such as a bridge between contacts, and the subsequent process becomes difficult. In one aspect, the present invention overcomes some of these problems.

Because on substrate and gate electrode layers is filled with an interlayers insulating film which has a good filling characteristic (that is, which is reflowable) including an insulating material whose wet etch rate does not subject to damage by implanting contact impurity ions, present invention can prevent from occurring bridge between contacts by overetching the interlayer insulating film in a cleaning process for forming a contact hole without causing a void.

What is claimed is:

1. A method of manufacturing a semiconductor device having at least one self-aligned contact hole, comprising steps of:

forming conductive structures covered with a first insulating layer on a semiconductor substrate;

forming a second insulating layer on the semiconductor substrate with an insulating material which is reflowable, the second insulating layer having an etching selectivity with respect to the first insulating layer;

planarization etching the second insulating layer until the first insulating layer covering the conductive structures is exposed;

forming a third insulating layer on the second insulating layer, including on the conductive structures, with an insulating material whose wet etch rate is lower than that of the second insulating layer, the third insulating layer having an etching selectivity with respect to the first insulating layer;

partially etching the third and the second insulating layers to expose a portion of the semiconductor substrate between the conductive structures to form at least one contact hole;

cleaning the at least one contact hole; and filling the at least one contact hole with a conductive material to form a contact electrically connected with the semiconductor substrate.

2. The method according to claim 1, further comprising implanting impurity ions so as to decrease a contact resistance, by utilizing the third insulating layer as a mask, before the cleaning the contact holes.

3. The method according to claim 1, further comprising forming a material layer over the substrate including the conductive structures with a material having an etching selectively with respect to the second and the third insulating layer.

4. A method of manufacturing a semiconductor device having at least one self-aligned contact hole comprising:

forming a first insulating layer, a first conductive layer, and a second insulating layer on a semiconductor substrate, in order;

partially etching the second insulating layer and the first conductive layer to form a gate electrode Structure having sidewalls;

forming a third insulating layer on the semiconductor substrate;

etching the third insulating layer to form a spacer on said side walls of the gate electrode structure;

forming a fourth insulating layer on the semiconductor substrate with an insulating material which is reflowable, the fourth insulating layer having an etching selectivity with respect to the second and the third insulating layers;

planarization etching the fourth insulating layer until the fourth insulating layer has a planar upper surface disposed below the upper surface of the gate electrode structure;

forming a fifth insulating layer on the fourth insulating layer, including on the gate electrode structure, with an insulating material whose wet etch rate is lower than that of the fourth insulating layer, the fifth insulating layer having an etching selectivity with respect to the second and the third insulating layers;

partially etching the fifth, the fourth, and the first insulating layers to expose a portion of semiconductor substrate to form at least one contact hole;

cleaning the at least one contact hole; and filling the at least one contacts hole with conductive material to form a contact electrically connected with the semiconductor substrate.

5. The method as in claim 4, wherein the second and the third insulating layers are silicon nitride layers, and the fourth and the fifth insulating layers are oxide layers.

6. The method as in claim 4, wherein the fourth insulating layer is formed of BPSG.

7. The method as in claim 4, wherein the fifth insulating layer is formed of TEOS.

8. The method as in claim 4, further comprising implanting impurity ions so as to decrease a contact resistance, by utilizing the fifth insulating layer as a mask, before the contact hole is filled with the conductive material.

* * * * *